(12) United States Patent
Marakhtanov et al.

(10) Patent No.: US 9,337,004 B2
(45) Date of Patent: May 10, 2016

(54) GROUNDED CONFINEMENT RING HAVING LARGE SURFACE AREA

(75) Inventors: Alexei Marakhtanov, Albany, CA (US); Rajhinder Dhindsa, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1207 days.

(21) Appl. No.: 12/570,359

(22) Filed: Sep. 30, 2009

(65) Prior Publication Data

US 2010/0252200 A1 Oct. 7, 2010

Related U.S. Application Data

(60) Provisional application No. 61/166,980, filed on Apr. 6, 2009.

(51) Int. Cl.
| | | |
|---|---|---|
| *C23C 16/00* | (2006.01) | |
| *C23F 1/00* | (2006.01) | |
| *H01L 21/306* | (2006.01) | |
| *H01J 37/32* | (2006.01) | |

(52) U.S. Cl.
CPC ..... *H01J 37/32642* (2013.01); *H01J 37/32422* (2013.01); *H01J 37/32495* (2013.01); *H01J 37/32623* (2013.01)

(58) Field of Classification Search
CPC .............. H01J 37/32623; H01J 37/32633; H01J 37/32651
USPC ............... 156/345.43–345.47; 118/715, 722, 118/723 R, 723 E; 315/111.21
See application file for complete search history.

(56) References Cited

U.S. PATENT DOCUMENTS 5,641,375 A * 6/1997 Nitescu et al. ............. 156/345.1
6,842,147 B2 1/2005 Howald et al.

(Continued)

FOREIGN PATENT DOCUMENTS

JP 08-172080 7/1996

OTHER PUBLICATIONS

Notification of Examination Opinions issued Mar. 6, 2015 for Taiwanese Patent Appln. No. 99110612.

*Primary Examiner* — Rakesh Dhingra
(74) *Attorney, Agent, or Firm* — Buchanan Ingersoll & Rooney PC

(57) ABSTRACT

A wafer processing system is provided for use with a driver and a material supply source. The driver is operable to generate a driving signal. The material supply source is operable to provide a material. The wafer processing system includes an upper confinement chamber portion, a lower confinement chamber portion, a confinement ring, and an electro-static chuck. The upper confinement chamber portion has an upper confinement chamber portion inner surface. The lower confinement chamber portion is detachably disposed in contact with the upper confinement chamber portion. The lower confinement chamber portion has a lower confinement chamber portion inner surface. The confinement ring is removably disposed in contact with the upper confinement chamber portion inner surface and the lower confinement chamber portion inner surface. The confinement ring has a confinement ring inner surface. The electro-static chuck has an electro-static chuck upper surface and is arranged to receive the driving signal. The upper confinement chamber portion, the lower confinement chamber portion, the confinement ring and the electro-static chuck are arranged such that the upper confinement chamber portion inner surface, the lower confinement chamber portion inner surface, the confinement ring inner surface and the electro-static chuck upper surface surround a plasma-forming space that is capable of receiving the material. The upper confinement chamber portion, the lower confinement chamber portion, the confinement ring and the electro-static chuck are operable to transform the material into a plasma when the electro-static chuck receives the driving signal. The confinement ring has a non-rectangular cross section.

14 Claims, 5 Drawing Sheets

(56) References Cited

U.S. PATENT DOCUMENTS

| | | | |
|---|---|---|---|
| 6,863,835 B1* | 3/2005 | Carducci | C23C 16/4412 118/723 E |
| 7,404,879 B2 | 7/2008 | Tolmachev et al. | |
| 2004/0085246 A1 | 5/2004 | Howald et al. | |
| 2004/0206309 A1* | 10/2004 | Bera et al. | 118/728 |
| 2007/0158027 A1* | 7/2007 | Aoki | H01J 37/32633 156/345.43 |
| 2011/0100552 A1 | 5/2011 | Dhindsa et al. | |
| 2011/0100553 A1 | 5/2011 | Dhindsa et al. | |
| 2011/0108524 A1 | 5/2011 | Dhindsa et al. | |

* cited by examiner

GROUNDED CONFINEMENT RING HAVING LARGE SURFACE AREA

The present application claims benefit under 35 U.S.C. §119 (e) to U.S. provisional patent application 61/166,980, filed Apr. 6, 2009, the entire disclosure of which is incorporated herein by reference.

BACKGROUND

The semiconductor manufacturing industry places an increased emphasis on cost savings to compensate for a constantly dwindling profit margin. Development of high aspect ratio contact etchers requires extremely high ion energy at a substrate surface.

The requirement of using extremely high ion energies in plasma etching processes further complicates the issue of maximizing throughput while minimizing cost of maintenance of plasma reactor parts. Specifically, when high energy ions are used in a reactor to bombard a wafer surface, the inside of the reactor exposed to the plasma is also bombarded with high energy ions, thus increasing the wear rate of the reactor parts.

FIG. 1 is a cross-sectional illustration of a conventional small volume chamber wafer processing system during a conventional small volume chamber etching process. System 100 has a rectangular cross-section that includes a grounded upper confinement chamber portion 102, a grounded lower confinement chamber portion 104, a removable floating confinement ring 108, an electro-static chuck (ESC) 106, a radio frequency (RF) driver 110 connected to ESC 106 and an exhaust portion 114. A plasma-forming space 112 is bounded by ESC 106, grounded upper confinement chamber portion 102, grounded lower confinement chamber portion 104 and removable floating confinement ring 108.

Grounded upper confinement chamber portion 102 is able to be detachably disposed from grounded lower confinement chamber portion 104 at boundary 120, as indicated by the arrow. When detached, removable floating confinement ring 108 may be serviced or replaced, and further, a wafer may be disposed onto ESC 106 for processing.

When a plasma is in contact with a negatively biased surface, such as an electrode or wall, a strong localized electric field appears between the plasma and that surface. This boundary layer, called a "plasma sheath," is a region of very low electron density, and serves as a medium to accelerate ions from the plasma to the electrode or wall surface. The energy that the ions gain as they are accelerated through plasma sheath regulates both the physical and chemical process at the surfaces surrounding the plasma.

During an etching process, plasma sheath 118 of thickness t1 122 forms between plasma 116 and the surrounding solid surfaces exposed to plasma-forming space 112 (grounded upper confinement chamber portion 102, grounded lower confinement chamber portion 104, removable floating confinement ring 108, and ESC 106). For simplicity in explanation, it is assumed that for small volume wafer processing system 100, the electrode area of ESC 106 is about the same as the electrode area of the grounded surfaces exposed to plasma-forming space 112 (grounded upper confinement chamber portion 102, grounded lower confinement chamber portion 104, and removable floating confinement ring 108). If the relative electrode areas of ESC 106 and the grounded surfaces exposed to plasma-forming space 112 were very different, the plasma sheath between plasma 116 and ESC 106 would be different than that between plasma 116 and the grounded surfaces. The role of electrode areas in determining plasma sheaths will be discussed in more detail later.

In the figure, a wafer 124 is held on ESC 106 via an electrostatic force. A voltage differential is provided between ESC 106 and grounded portions (grounded upper confinement chamber portion 102, grounded lower confinement chamber portion 104, and removable floating confinement ring 108), via RF driver 110, while pressure is decreased in plasma-forming space 112. Further, an etching material is supplied into plasma-forming space 112 via an etching material source (not shown). The pressure within plasma-forming space 112 and the voltage differential, as created by RF driver 110, is set such that the etching material supplied into plasma-forming space 112 creates plasma 116. Plasma 116 etches material within plasma-forming space 112, which includes wafer 124.

As discussed previously, plasma sheath 118 of thickness $t_1$ 122 extends between plasma 116 and a bottom surface 126 of grounded upper confinement chamber portion 102, an inner surface 128 of removable floating confinement ring 108, a top surface 130 of grounded lower confinement chamber portion 104, and ESC 106. As RF voltage is applied to electrode 106, plasma is formed and ions within plasma 116 are accelerated through plasma sheath 118 to perform the etching process.

During an etching process, extremely high ion energies are typically needed. Such extremely high ion energies can be achieved by increasing an applied RF voltage to ESC 106 as supplied by RF driver 110. The ion energies of plasma 116 are defined by the potential difference between wafer 124 and plasma 116. Wafer DC bias is related to the electrode area ratio between ESC 106 and grounded upper confinement chamber portion 102, removable floating confinement ring 108 and grounded lower confinement chamber portion 104. DC bias is also directly related to the difference between the potential of plasma 116 with respect to the grounded surfaces (grounded upper confinement chamber portion 102, removable floating confinement ring 108 and grounded lower confinement chamber portion 104) and the potential of plasma 116 with respect to wafer 124. The electrode area and the corresponding wafer DC bias will be discussed in more detail below.

The combined electrode area of the powered electrode with respect to the combined electrode area of the grounded surfaces is conventionally referred to as the electrode area ratio. The electrode area ratio is a function of the areas of the physical surfaces and is also a function of the electrical properties of the materials of the physical surfaces. Using different materials for parts of system 100 may change the electrical properties thereof by changing the impedance between the ESC 106 and grounded upper confinement chamber portion 102, removable floating confinement ring 108 and grounded lower confinement chamber portion 104. In this light, removable floating confinement ring 108 may be removably disposed and replaced with a different confinement ring having different electrical properties and having it either electrically floating or grounded. Such a replacement may change the electrical properties of system 100 thus changing the area ratio and ultimately changing the DC bias between ESC 106 and grounded upper confinement chamber portion 102 and grounded lower confinement chamber portion 104.

High aspect ratio (HAR) etching typically demands extremely high ion energies at the surface of wafer 124, and therefore may require increased driving voltages from RF driver 110, for increased periods of time. These increased driving voltages result in higher plasma potential within plasma-forming space 112 therefore resulting in higher energy ions bombarding the grounded surfaces (bottom surface 126 of grounded upper confinement chamber portion 102, inner surface 128 of removable floating confinement ring 108 and top surface 130 of grounded lower confinement chamber portion 104) as well as the surface of wafer 124.

To minimize the accelerated wear of parts of system 100, the plasma potential, and therefore t1 sheath potential may be adjusted by increasing the electrode area ratio between ESC 106 and the grounded portions, i.e., grounded upper confinement chamber portion 102 and grounded lower confinement chamber portion 104. The electrode area ratio may be increased by increasing at least one of the physical surface area or changing the electrical properties of at least one of grounded upper confinement chamber portion 102 and grounded lower confinement chamber portion 104.

A conventional large volume chamber wafer processing system, which will be discussed in more detail below, has an increased electrode area ratio over the conventional small volume chamber wafer processing system as discussed above. Specifically, the conventional large volume chamber wafer processing system has a much larger plasma-forming space, which is bounded by grounded surfaces, as compared to the plasma-forming space of the conventional small volume chamber wafer processing system. Therefore, the conventional large volume chamber wafer processing system has a much larger grounded surface area as compared to the grounded surface area in the conventional small volume chamber wafer processing system. As such, the conventional large volume chamber wafer processing system has an increased wafer DC bias as compared to the conventional small volume chamber wafer processing system. Large ground-to-powered electrode area ratio not only increases the ion energy at the wafer surface but decreases the plasma potential, and therefore decreases wear rate of grounded chamber parts that face plasma.

An example conventional large volume chamber wafer processing system will now be described with reference to FIG. 2.

FIG. 2 is a cross-sectional illustration of a conventional large volume chamber wafer processing system during a conventional large volume chamber etching process. System 200 includes a grounded upper confinement chamber portion 202, a grounded lower confinement chamber portion 204, a grounded chamber wall portion 208, an ESC 132, and an RF driver 210 connected to ESC 206. A plasma-forming space 212 is bounded by grounded upper confinement chamber portion 202, grounded lower confinement chamber portion 204, ESC 206 and grounded chamber wall portion 208.

A wafer 220 is held onto ESC 206 via an electrostatic force. RF driver 210 provides an RF signal to ESC 206 to create plasma 224, similar to the manner discussed above, in plasma-forming space 212. Plasma sheath 218 of thickness $t_2$ 226 exists between plasma 224 and grounded surfaces (grounded upper confinement chamber portion 202, grounded lower confinement chamber portion 204, and grounded chamber wall portion 208). A different plasma sheath (not shown) with a larger thickness exists between plasma 224 and wafer 220, since now the electrode area of the powered electrode (ESC 206) is different from the area of the grounded electrodes. This difference in the plasma sheaths allows for high-energy ions (corresponding to thicker plasma sheath and larger sheath potential) to be provided to the surface of wafer 220 while low-energy ions (corresponding to thinner plasma sheath and smaller sheath potential) to be provided to the grounded chamber portions.

Plasma-forming space 212 includes a first plasma-forming space portion 216, which corresponds to plasma-forming space 112 as discussed above with reference to system 100 in FIG. 1, in addition to plasma-forming space 214. With larger plasma-forming space 212, as compared to plasma-forming space 112, system 200 has a larger grounded surface area as compared to the grounded surface area of system 100. Specifically: grounded upper confinement chamber portion 202 of system 200 has a larger surface area than grounded upper confinement chamber portion 102 of system 100; grounded lower confinement chamber portion 204 of system 200 has a larger surface area than grounded lower confinement chamber portion 104 of system 100; and grounded chamber wall portion 208 of system 200 has a larger surface area than removable floating confinement ring 108 of system 100.

The increased surface area described above provides a larger area ratio between ESC 206 and grounded chamber portions, which in this case include grounded upper confinement chamber portion 202, grounded lower confinement chamber portion 204 and grounded chamber wall portion 208. As mentioned previously, this larger area ratio increases ion energy at wafer 220 while decreasing the potential of plasma 224 with respect to ground and decreasing the thickness $t_2$ 226 of plasma sheath 218. The potential of plasma sheath 218 is smaller than the potential of plasma sheath 118, and therefore results in lower ion energy provided to the grounded chamber portions, and thus resulting in lower wear rate. The difference between the potentials of sheath 218 and sheath 118 is related to the difference in the electrode area ratio of system 200 and the area ratio of system 100. Thus system 200 is able to provide less plasma sheath potential (and therefore less ion energy) to its grounded chamber portions than system 100.

The increased ion energy at wafer 220 increases the etch rate of system 200 over system 100. This is the benefit of a conventional large volume chamber as compared to a conventional small volume chamber.

Unlike the conventional small volume chamber shown in FIG. 1, the conventional large volume chamber shown in FIG. 2 does not include a removable floating confinement ring. Therefore, unlike the conventional small volume chamber shown in FIG. 1, the electrical properties of chamber of FIG. 2 may not be readily changed in order to adjust the area ratio and ultimately adjust and optimize the wafer DC bias.

The overall trade off with system 200 of FIG. 2 as compared to system 100 of FIG. 1, is that system 200 has an increase in wafer DC bias over the wafer DC bias of system 100, whereas system 200 has more expensive overall operation and less flexibility with no replaceable floating confinement ring.

What is needed is a chamber wafer processing system that has an increased wafer DC bias over the conventional small volume chamber wafer processing system while providing less operating costs than the conventional large volume chamber wafer processing system.

BRIEF SUMMARY

It is an object of the present invention to provide chamber wafer processing system that has an increased wafer DC bias over the conventional small volume chamber wafer processing system while providing less operating costs than the conventional large volume chamber wafer processing system.

In accordance with an aspect of the present invention, wafer processing system is provided for use with a driver and a material supply source. The driver is operable to generate a driving signal. The material supply source is operable to provide a material. The wafer processing system includes an upper confinement chamber portion, a lower confinement chamber portion, a confinement ring, and an electro-static chuck. The upper confinement chamber portion has an upper confinement chamber portion inner surface. The lower confinement chamber portion is detachably disposed in contact with the upper confinement chamber portion. The lower confinement chamber portion has a lower confinement chamber portion inner surface. The confinement ring is removably disposed in contact with the upper confinement chamber portion inner surface and the lower confinement chamber portion inner surface. The confinement ring has a confinement ring inner surface. The electro-static chuck has an electro-static chuck upper surface and is arranged to receive the driving signal. The upper confinement chamber portion, the lower confinement chamber portion, the confinement ring and the electro-static chuck are arranged such that the upper confinement chamber portion inner surface, the lower confinement chamber portion inner surface, the confinement ring inner surface and the electro-static chuck upper surface surround a plasma-forming space that is capable of receiving the material. The upper confinement chamber portion, the lower confinement chamber portion, the confinement ring and the electro-static chuck are operable to transform the material into a plasma when the electro-static chuck receives the driving signal. The confinement ring has a non-rectangular cross section.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an example embodiment of the present invention and, together with the description, serve to explain the principles of the invention. In the drawings.

DETAILED DESCRIPTION

In accordance with an aspect of the present invention, a small volume chamber wafer processing system includes a confinement ring that is shaped so as to have an increased surface area over those of conventional confinement rings. Accordingly, a confinement ring in accordance with the present invention will provide an increased area ratio between a powered electrode and grounded surfaces to provide an increased wafer DC bias. Therefore, a small volume chamber wafer processing system in accordance with the present invention provides increased wafer DC bias over the conventional small volume chamber wafer processing system while providing lower operating costs than the conventional large volume chamber wafer processing system.

Figure 3:
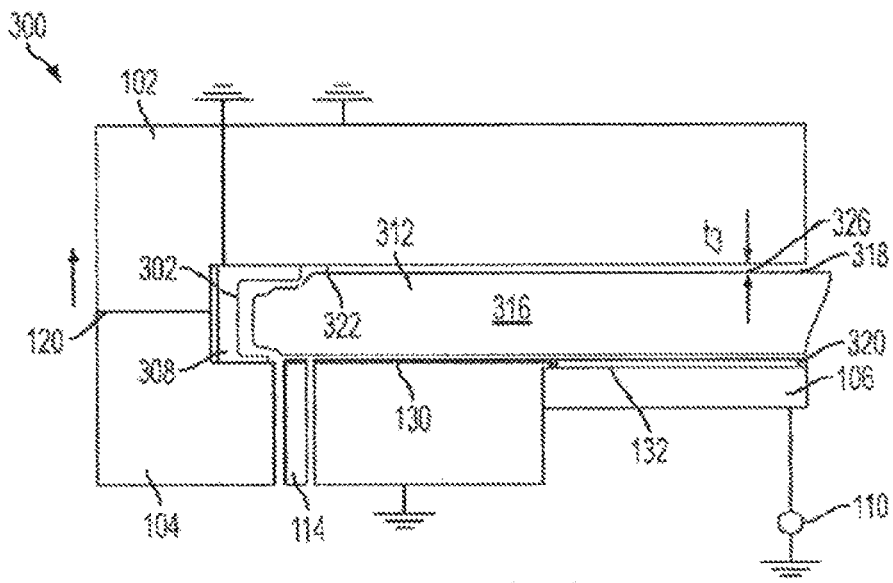
FIG. 3 is a cross-sectional illustration of an example small volume chamber wafer processing system using a removable C-shaped grounded confinement ring in accordance with an aspect of the present invention during an example wafer etching process.

Example aspects of the present invention will now be described below with reference to FIGS. 3-5.

An example small volume chamber wafer processing system in accordance with an aspect of the present invention, during a wafer processing process (etching), will now be described with reference to FIG. 3.

In the figure, system 300 includes grounded upper confinement chamber portion 102, grounded lower confinement chamber portion 104, a removable C-shaped grounded confinement ring 308, ESC 106, RF driver 110 connected to ESC 106 and exhaust portion 114. A plasma-forming space 312 is bounded by top surface 206 of ESC 106, grounded bottom surface 322 of upper confinement chamber portion 102, top surface 130 of grounded lower confinement chamber portion 104 and inner surface 302 of removable C-shaped grounded confinement ring 308.

A wafer 320 is held onto ESC 106 via an electrostatic force. RF driver 110 provides an RF signal to ESC 106 to create plasma 316, similar to the manner discussed above in reference to FIG. 3, in plasma-forming space 312. Plasma sheath 318 of thickness $t_3$ 326 exists between plasma 316 and grounded surfaces (grounded upper confinement chamber portion 102, grounded lower confinement chamber portion 104, and removable C-shaped grounded confinement ring 308.)

Since removable C-shaped grounded confinement ring 308 has a non-rectangular cross section as compared to the rectangular cross section of removable floating confinement ring 108, system 300 has a larger grounded surface area as compared to the grounded surface area of system 100.

Figure 1:
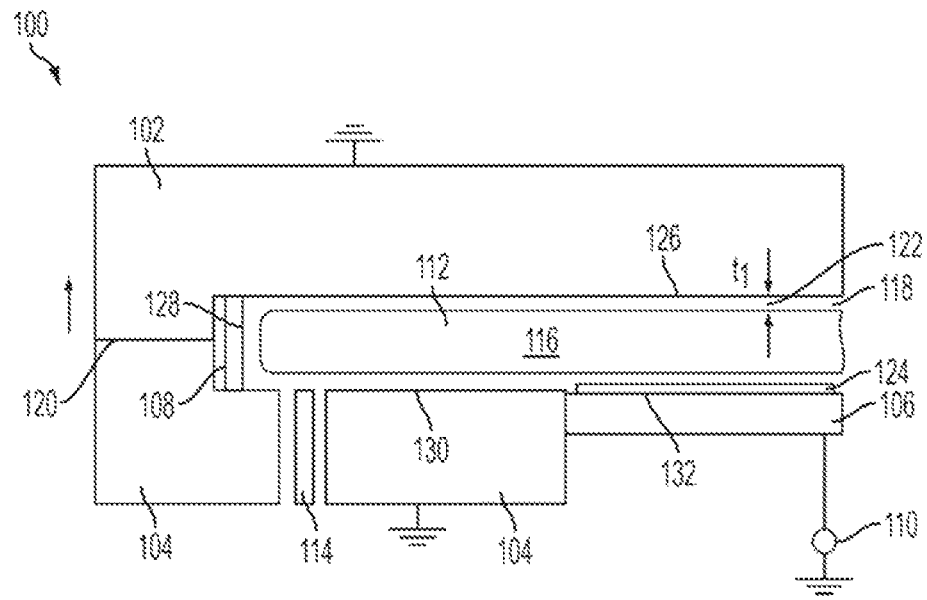
FIG. 1 is a cross-sectional illustration of a conventional small volume chamber wafer processing system during a conventional small volume chamber etching process.
Figure 2:
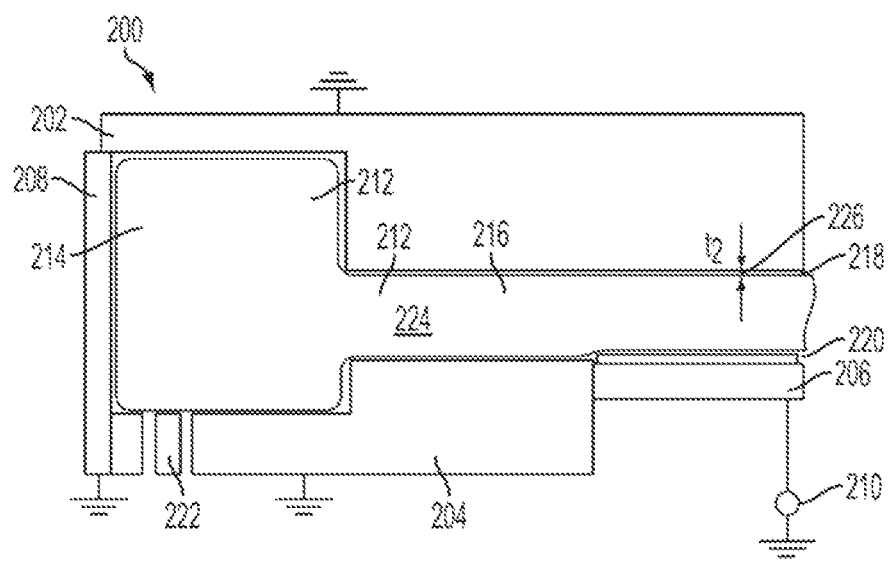
FIG. 2 is a cross-sectional illustration of a conventional large volume chamber wafer processing system during a conventional large volume chamber etching process.

The increased grounded surface area in accordance with this aspect of the present invention provides a larger area ratio between ESC 106 and grounded chamber portions, which include grounded upper confinement chamber portion 102, grounded lower confinement chamber portion 104 and removable C-shaped grounded confinement ring 308 as compared to the conventional system discussed above with respect to FIG. 1. This larger area ratio increases wafer DC bias and increases ion energy at wafer 320. The larger area ratio additionally provides less plasma potential to plasma 316 with respect to grounded upper confinement chamber portion 102, grounded lower confinement chamber portion 104 and removable C-shaped grounded confinement ring 308 as compared to the conventional system discussed above with respect to FIG. 1. Specifically, because of the decreased plasma potential thickness $t_3$ 326 of plasma sheath 318 is less than thickness $t_1$ 122 of plasma sheath 118 as provided by system 100 of FIG. 1.

Therefore, by increasing the surface area of the confinement ring, e.g., using removable C-shaped grounded confinement ring 308 as opposed to rectangular removable floating confinement ring 108, the thickness of the resulting plasma sheath is decreased from thickness $t_1$ 122 to thickness $t_3$ 326 around grounded upper confinement chamber portion 102, grounded lower confinement chamber portion 104 and removable C-shaped grounded confinement ring 308.

It should be noted that while thickness $t_3$ 326 of plasma sheath 318 is less than thickness $t_1$ 122 of plasma sheath 118, thickness $t_3$ 326 is not as thin as thickness $t_2$ 226 of plasma sheath 218. Thus system 300 is operable to generate plasma 316 having greater wafer DC bias and less plasma potential with respect to its grounded chamber portions than system 100, but is operable to generate plasma 316 having less wafer DC bias and more plasma potential with respect to its grounded chamber portions than system 200.

Figure 4:
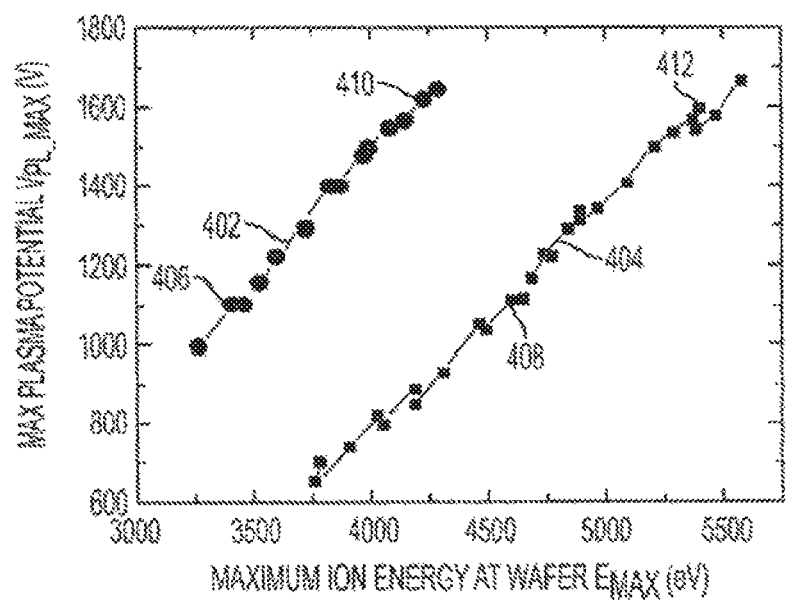
FIG. 4 graphically illustrates the conventional small volume chamber wafer processing system of FIG. 1, compared to the example small volume chamber wafer processing system of FIG. 3 using a removable C-shaped grounded confinement ring during an example wafer etching process.
Figure 5:
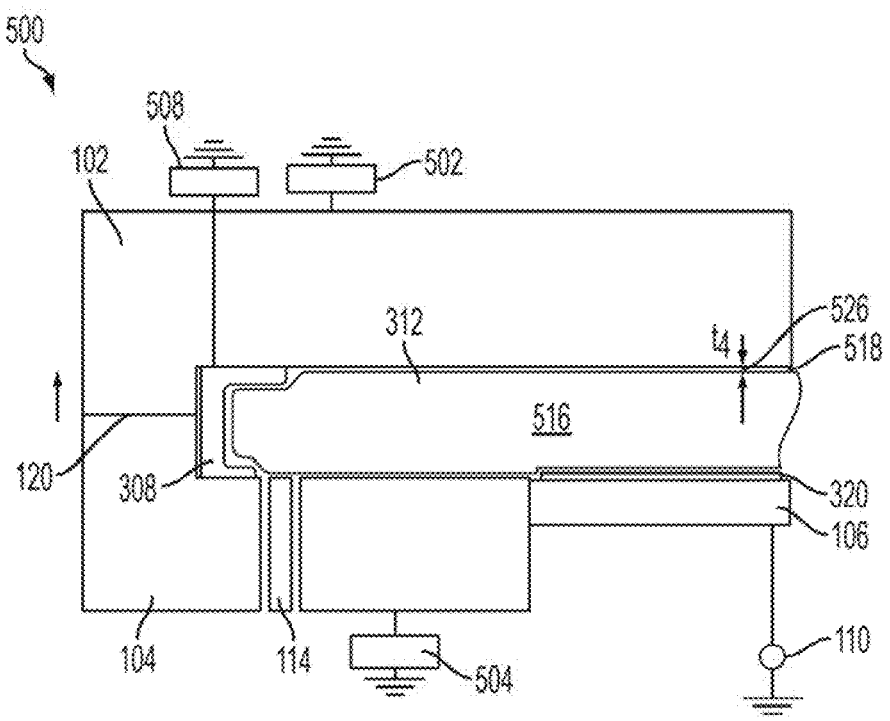
FIG. 5 is a cross-sectional illustration of another example small volume chamber wafer processing system using a removable C-shaped grounded confinement ring in accordance with an aspect of the present invention during an example wafer etching process using filters.

FIG. 4 is a graph having an x-axis representing a maximum ion energy, measured in electron-volts, at a wafer surface during an etching process and a y-axis representing a maximum plasma potential, measured in volts. In the graph, a function 402 corresponds to measured results for system 100 using removable floating confinement ring 108. Further, a function 404 corresponds to measured results for system 300 using a removable C-shaped grounded confinement ring 308 in accordance with an aspect of the present invention.

As clearly indicated by comparing function 402 with function 404, system 300 using removable C-shaped grounded confinement ring 308 in accordance with an aspect of the present invention provides much higher maximum ion energy at the wafer for a given maximum plasma potential than that of system 100 using removable floating confinement ring 108.

For example, data point 406 on function 402 indicates that system 100 using removable floating confinement ring 108 provides a maximum plasma potential of approximately 1100 V for a maximum ion energy at the wafer of approximately 3400 eV (Electron Volts). In contrast, data point 408 on function 404 indicates that system 300 using a removable C-shaped grounded confinement ring 308 in accordance with an aspect of the present invention provides a maximum plasma potential of approximately 1100 V for a maximum ion energy at the wafer of approximately 4600 eV.

Similarly, data point 410 on function 402 indicates that system 100 using removable floating, confinement ring 108 provides a maximum plasma potential of approximately 1600 V for a maximum ion energy at the wafer of approximately 4200 eV. In contrast, data point 412 on function 404 indicates that system 300 using a removable C-shaped grounded confinement ring 308 in accordance with an aspect of the present invention provides a maximum plasma potential of approximately 1600 V for a maximum ion energy at the wafer of approximately 5300 eV.

In other words, for the same maximum plasma potential, system 300 using removable C-shaped grounded confinement ring 308 in accordance with an aspect of the present invention provides an approximate 30% increase in the maximum ion energy at the wafer as compared to system 100 using removable floating confinement ring 108. An increased ion energy at the wafer surface produces an increased etch rate. Accordingly, using removable C-shaped grounded confinement ring 308 in accordance with an aspect of the present invention provides increased etch rate as compared to system 100 using removable floating confinement ring 108.

Nevertheless, using a removable C-shaped grounded confinement ring 308 in accordance with an aspect of the present invention will provide a decreased ion energy as compared to system 200, which does not include any confinement ring. However, as discussed above, system 300 has a similar volume chamber as that of system 100. Therefore system 300 has a much smaller surface area to be cleaned after each processed wafer, as compared to system 200. Accordingly, system 300 using a removable C-shaped grounded confinement ring 308 in accordance with an aspect of the present invention has a decreased cost of operation, i.e., decreased power, money, time and material to operate, as compared to system 200.

Another benefit of system 300 is that C-shaped grounded confinement ring 308 may be replaced to modify the electrical properties of system 300. The electrical properties may therefore be readily modified in order to adjust the area ratio and ultimately adjust and optimize the wafer DC bias for specific applications. Removable C-shaped grounded confinement ring 308 may also be negatively affected over time (through use) but may be replaced at a fraction of the cost of replacing the entire chamber. In contrast, since system 200 does not have a removable confinement ring it does not have this flexibility to optimize the wafer DC bias of the chamber or be repaired/replaced due to wear. This will further reduce the cost of operation of system 300 as compared with the cost of operation of system 200.

Another example small volume chamber wafer processing system in accordance with an aspect of the present invention will now be described with reference to FIG. 5.

In the figure, system 500 includes grounded upper confinement chamber portion 102, grounded lower confinement chamber portion 104, a removable C-shaped grounded confinement ring 308, ESC 106, RF driver 110 connected to ESC 106, and exhaust portion 114. System 500 additionally includes RF filter 502, RF filter 504 and RF filter 508. Each of RF filters 502, 504 and 508 may take the form of any known filter that is operable to control RF current to ground.

A change in impedance will change ion energy at wafer 320 and will change the potential of plasma 516 with respect to ground. As such, a change in impedance may change the thickness $t_4$ 526 of plasma sheath 518 as compared to the thickness $t_3$ 326 of plasma sheath 318. Being able to change the impedance of grounded chamber portions thus allows for adjustment of plasma shape and also ion energies.

In the example embodiments discussed above with reference to FIGS. 3 and 5, the grounded confinement ring is referred to as a "C-shaped" grounded confinement ring because the non-rectangular cross sectional shape resembles a "C". However, other embodiments of grounded confinement ring in accordance with an aspect of the present invention have a non-rectangular cross sectional shape that does not resemble a C, but still have an increased surface area as compared to a grounded confinement ring having a rectangular cross sectional shape. Additional example embodiments of non-rectangular grounded confinement rings will now be described below with reference to FIGS. 6-9.

Another example small volume chamber wafer processing system in accordance with an aspect of the present invention, during a wafer processing process (etching), will now be described with reference to FIG. 6.

In the figure, system 600 includes grounded upper confinement chamber portion 102, grounded lower confinement chamber portion 104, a removable protrusioned grounded confinement ring 608, ESC 106, RF filter 502, RF filter 504, RF filter 508, RF driver 110 connected to ESC 106 and exhaust portion 114. System 600 differs from system 500 discussed above with reference to FIG. 5 in that removable C-shaped grounded confinement ring 501 has been replaced with removable protrusioned grounded confinement ring 608. The inner surface of removable protrusioned grounded confinement ring 608 has a plurality of protrusions 602, which therefore provides a larger surface area as compared to C-shaped grounded confinement ring 508. Protrusions 602 may take any shape, a non-limiting example of which includes long thin spikes.

Figure 6:
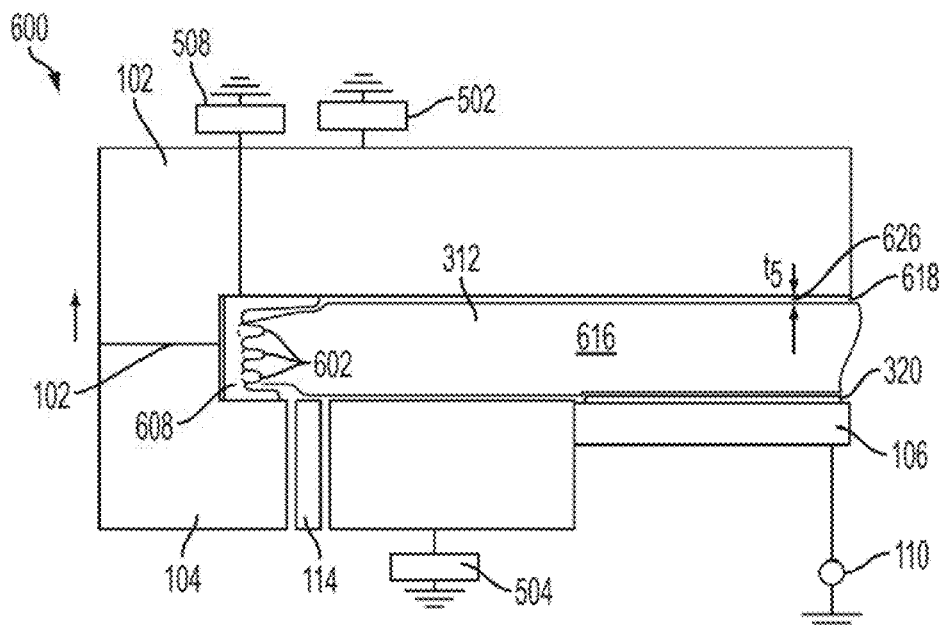
FIG. 6 is a cross-sectional illustration of the example small volume chamber wafer processing system of FIG. 5 using a modified removable C-shaped grounded confinement ring in accordance with an aspect of the present invention during an example wafer etching process.
Figure 7:
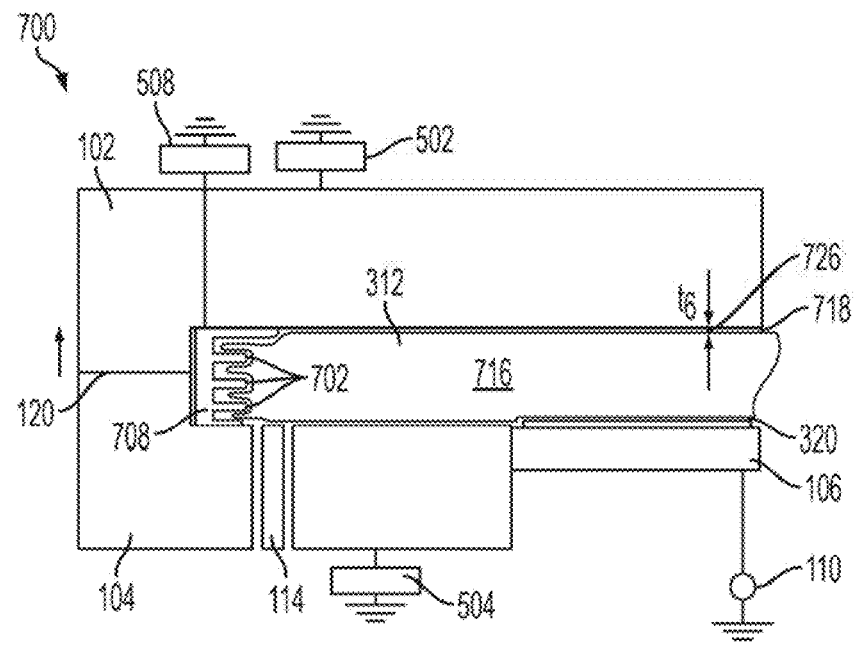
FIG. 7 is a cross-sectional illustration of the example small volume chamber wafer processing system of FIG. 5 using another modified removable C-shaped grounded confinement ring in accordance with an aspect of the present invention during an example wafer etching process.

Another example small volume chamber wafer processing system in accordance with an aspect of the present invention, during a wafer processing process (etching), is illustrated in FIG. 7. In the figure, system 700 differs from system 600 discussed above with reference to FIG. 6 in that removable protrusioned grounded confinement ring 608 has been replaced with removable finned grounded confinement ring 708. The inner surface of removable finned grounded confinement ring 708 has a plurality of fins 702, which therefore provides a larger surface area as compared to C-shaped grounded confinement ring 508.

Another example small volume chamber wafer processing system in accordance with an aspect of the present invention, during a wafer processing process (etching), will now be described with reference to FIG. 8. In the figure, system 800 differs from system 600 discussed above with reference to FIG. 6 in that removable protrusioned grounded confinement ring 608 has been replaced with removable spiked grounded confinement ring 808. The inner surface of removable spiked grounded confinement ring 808 has a plurality of spikes 802, which therefore provides a larger surface area as compared to C-shaped grounded confinement ring 508.

Another example small volume chamber wafer processing system in accordance with an aspect of the present invention, during a wafer processing process (etching), will now be described with reference to FIG. 9. In the figure, system 900 differs from system 600 discussed above with reference to FIG. 6 in that removable protrusioned grounded confinement ring 608 has been replaced with removable grounded confinement ring 908 having a convex portion 902. The inner surface of removable grounded confinement ring 908 has convex portion 902, which therefore provides a larger surface area as compared to C-shaped grounded confinement ring 908.

Figure 8:
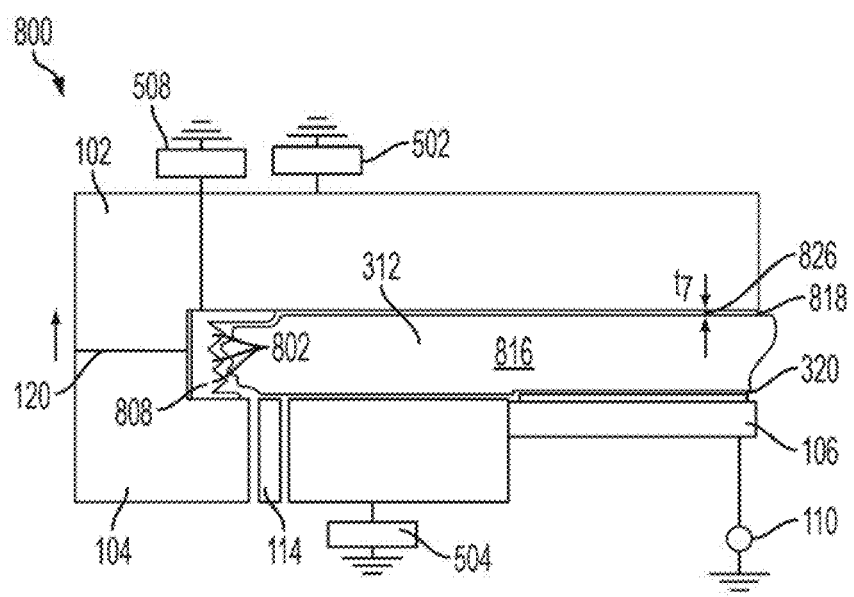
FIG. 8 is a cross-sectional illustration of the example small volume chamber wafer processing system of FIG. 5 using another modified removable C-shaped grounded confinement ring in accordance with an aspect of the present invention during an example wafer etching process.
Figure 9:
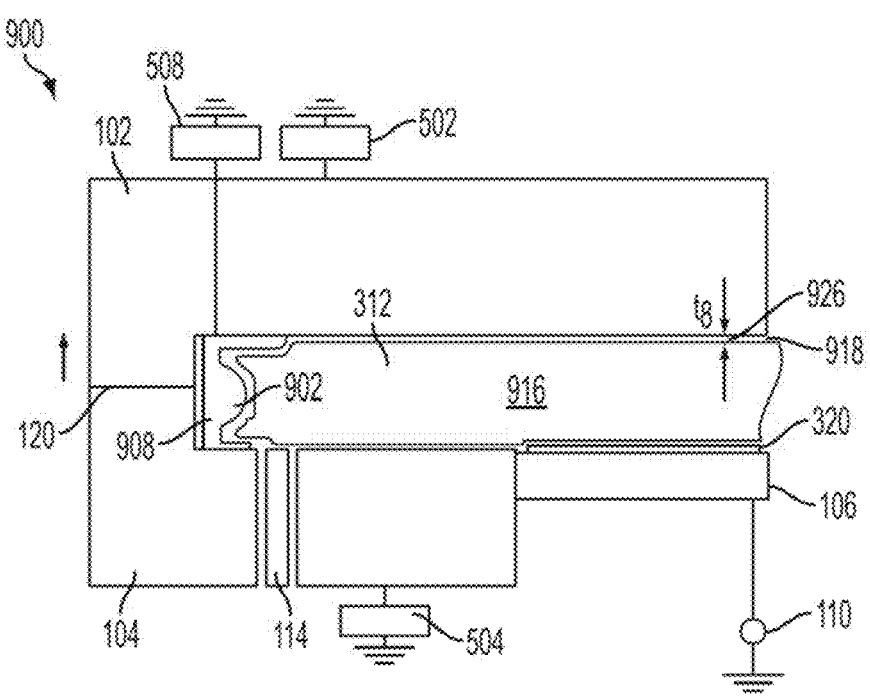
FIG. 9 is a cross-sectional illustration of the example small volume chamber wafer processing system of FIG. 5 using another modified removable C-shaped grounded confinement ring in accordance with an aspect of the present invention during an example wafer etching process.

As discussed above, each of removable protrusioned grounded confinement ring 608 of FIG. 6, removable finned grounded confinement ring 708 of FIG. 7, removable spiked grounded confinement ring 808 of FIG. 8 and removable grounded confinement ring 908 having a convex portion 902 of FIG. 9 provides a larger surface area as compared to C-shaped grounded confinement ring 908 of FIG. 9. Therefore, each of removable protrusioned grounded confinement ring 608, removable finned grounded confinement ring 708, removable spiked grounded confinement ring 808 and removable grounded confinement ring 908 has a larger total surface area of the grounded electrode as compared to system 500 of FIG. 5. Consequently, each of removable protrusioned grounded confinement ring 608, removable finned grounded confinement ring 708, removable spiked grounded confinement ring 808 and removable grounded confinement ring 908 is able to provide a larger wafer DC bias as compared to system 500 of FIG. 5. The larger wafer DC bias leads to an increased ion energy at wafer 320 and a decreased potential of plasma with respect to grounded electrodes. Therefore, a thickness $t_5$ 626 of plasma sheath 618 of system 600, a thickness $t_6$ 726 of plasma sheath 718 of system 700, a thickness $t_7$ 826 of plasma sheath 818 of system 800 and a thickness $t_8$ 926 of plasma sheath 918 of system 900 are each less than thickness $t_4$ 526 of plasma sheath 518 of system 500.

The overall benefit of system 500, 600, 700, 800 and 900 is the increased area ratio due to the added physical area of a grounded confinement ring with a non-rectangular cross section. Although each of system 600, system 700, system 800 and system 900 may provide an increased ion energy at wafer 320 as compared with system 500, each of system 600, system 700, system 800 and system 900 may have an increased cost of operation due the increased area that needs to be auto-cleaned. But polymer deposition on the surface of a grounded confinement ring can be controlled by heating up the grounded confinement ring elevated temperatures during etch processes.

Each of thickness $t_8$ 926, $t_7$ 826, $t_6$ 726 and $t_5$ 626 are less than the thickness $t_4$ 526 of plasma sheath 518, which is less than thickness $t_3$ 326. Systems 500, 600, 700, 800 and 900 also maintain the benefit of a small volume chamber system that reduces the WAC process, thus saving time, energy and money while increasing the lifespan of grounded upper confinement chamber portion 102, grounded lower confinement chamber portion 104 and removable grounded confinement rings 508, 608, 708, 808 and 908.

In accordance with aspects of the present invention a small volume chamber wafer processing system has an increased wafer DC bias compared to conventional small volume chamber wafer processing system 100 and provides less operating costs than conventional large volume chamber wafer processing system 200.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A wafer processing system for use with a RF driver and a material supply source that is operable to supply a material, the RF driver being operable to generate a driving signal such that material supplied by the material supply source can be transformed into plasma and a wafer may be plasma processed, said wafer processing system comprising:

an upper confinement chamber portion having a horizontally extending exposed bottom surface and a vertically extending portion;

a lower confinement chamber portion having a horizontally extending exposed top surface and a vertically extending portion, said lower confinement chamber portion and the said upper confinement chamber portion detachably disposed in direct contact with each other via their corresponding vertically extending portions;

a removable confinement ring consisting essentially of: a horizontally extending top annular wall outward of the exposed bottom surface of the upper confinement chamber portion, a horizontally extending bottom annular wall outward of the exposed top surface of the lower confinement chamber portion, and a vertically extending annular wall extending between outer peripheries of the respective horizontally extending top and bottom annular walls wherein an inner periphery of the horizontally extending bottom annular wall is radially outward of an inner periphery of the horizontally extending top annular wall; and an electro-static chuck having an electro-static chuck upper surface arranged to hold a wafer to be processed, wherein the exposed bottom surface of the upper confinement chamber portion, the exposed top surface of the lower confinement chamber portion, the electro-static chuck upper surface, and the removable confinement ring define a plasma forming space in which plasma can be generated when a wafer is processed.

2. The wafer processing system of claim 1, wherein said removable confinement ring has a c-shaped cross section.

3. The wafer processing system of claim 1, wherein an inner surface of the vertically extending annular wall comprises a protrusion.

4. The wafer processing system of claim 3, wherein said protrusion comprises a fin.

5. The wafer processing system of claim 3, wherein said protrusion comprises a spike.

6. The wafer processing system of claim 3, wherein said protrusion comprises a convex portion.

7. The wafer processing system of claim 3, wherein the inner surface of the vertically extending annular wall includes a plurality of protrusions.

8. The wafer processing system of claim 7, wherein the plurality of protrusions are shaped as spikes.

9. The wafer processing system of claim 7, wherein the plurality of protrusions are shaped as fins.

10. The wafer processing system of claim 7, wherein the plurality of protrusions are shaped as bumps.

11. The wafer processing system of claim 3, wherein the inner surface of the vertically extending annular wall includes a convex portion.

12. The wafer processing system of claim 1, wherein the plasma exposed top surface of the lower confinement chamber portion includes an exhaust portion formed therein that is radially inward of the horizontally extending bottom annular wall of the removable confinement ring.

13. The wafer processing system of claim 1, wherein a vertical distance between a lower surface of the horizontally extending top annular wall and an upper surface of the horizontally extending bottom annular wall is less than a vertical distance between the electro-static chuck upper surface and the exposed bottom surface of the upper confinement chamber portion so as to reduce plasma volume at an outer periphery of the plasma forming space when a wafer is processed in the wafer processing system.

14. The wafer processing system of claim 1, wherein an inner surface and an upper surface of the horizontally extending bottom annular wall, an inner surface of the vertically extending annular wall, and an inner surface and a lower surface of the horizontally extending top annular wall are exposed to plasma when a wafer is processed in the wafer processing system.

* * * * *